(12) United States Patent
Pullela et al.

(10) Patent No.: US 7,612,617 B2
(45) Date of Patent: Nov. 3, 2009

(54) VOLTAGE-CONTROLLED OSCILLATOR GAIN CALIBRATION FOR TWO-POINT MODULATION IN A PHASE-LOCKED LOOP

(75) Inventors: Rajasekhar Pullela, Colton, CA (US); Morten Damgaard, Laguna Hills, CA (US); Shahrzad Tadjpour, Irvine, CA (US); John E. Vasa, Irvine, CA (US); Hoon Lee, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 56 days.

(21) Appl. No.: 12/040,875

(22) Filed: Mar. 1, 2008

(65) Prior Publication Data
US 2009/0219100 A1 Sep. 3, 2009

(51) Int. Cl.
*H03L 7/099* (2006.01)
*H03L 7/18* (2006.01)

(52) U.S. Cl. ............................. 331/16; 331/17; 331/25; 331/44; 375/376

(58) Field of Classification Search ................. 331/1 A, 331/8, 10, 14, 16–18, 25, 44; 327/156–159; 332/127; 360/51; 375/376; 455/260
See application file for complete search history.

(56) References Cited

U.S. PATENT DOCUMENTS

2004/0156465 A1 * 8/2004 Schmandt .................... 375/376

* cited by examiner

*Primary Examiner*—David Mis

(57) ABSTRACT

A phase-locked loop (PLL) is arranged to receive high-pass data at a first input and low-pass data at a second input. A first digital input is coupled to a primary path through a digital-to-analog converter (DAC) and a second digital input is coupled to a feedback path of the PLL. The controller provides the first input and the second input during a calibration procedure. The controller adjusts first and second control inputs in an attempt to keep the input voltage to a voltage-controlled oscillator (VCO) in the PLL constant while determining the gain of the VCO in Hz/LSB.

20 Claims, 5 Drawing Sheets

VOLTAGE-CONTROLLED OSCILLATOR GAIN CALIBRATION FOR TWO-POINT MODULATION IN A PHASE-LOCKED LOOP

BACKGROUND

This invention relates generally to transceiver architecture in a wireless portable communication device. More particularly, the invention relates to systems and methods for performing a gain calibration in open loop and closed loop data paths in a multiple mode transceiver.

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband time-division multiple access (TDMA), a Gaussian minimum shift keying (GMSK) modulation scheme is used to communicate data.

The deployment of new wireless systems presents unique challenges to mobile handset designers. In order to reap the full benefit of expanded capacity and increased data bandwidth, the new handsets must work on both the new systems as well as the old. One of these new systems has been named Enhanced Data Rates for GSM Evolution (EDGE). The EDGE standard is an extension of the Global System for Mobile Communications (GSM) standard.

The EDGE standard increases the data rate over that available with GSM by sending more bits per RF burst. More bits are sent in EDGE by using a modulation scheme based on 8-phase shift keying (8-PSK), which provides an increase over GSM's Gaussian minimum shift keying (GMSK) modulation format. In the EDGE modulation scheme, the 8-PSK constellation is rotated 3 radians every symbol period to avoid problems associated with zero crossings. In contrast to GMSK's constant amplitude envelope, the added rotation factor in the EDGE modulation scheme results in a non-constant amplitude envelope. This non-constant amplitude envelope presents some difficulties with regard to RF power control. These problems are exacerbated by the desire to have a single transmitter that can be used for both the GSM and EDGE standards.

The two point modulation scheme used to support both GMSK and EDGE sets stringent requirements on gain alignment (voltage-controlled oscillator (VCO) gain or $K_{VCO}$) between open loop and closed loop data paths in the transmitter. Simulations indicate that in order to meet the spectral mask specifications for both standards, $K_{VCO}$ should be determined to an accuracy of less than 2%.

In order to account for the effects of channel frequency variation and temperature drift, $K_{VCO}$ must be measured or otherwise determined before the start of each transmit burst. In some transmitter embodiments, approximately 150 microseconds is available to measure and adjust $K_{VCO}$, perform any required digital frequency centering, and to settle the phase-locked loop. Thus, approximately 50 to 100 microseconds is available before the start of each data burst to measure and adjust $K_{VCO}$.

One approach to measure $K_{VCO}$ uses a first digital input signal which is converted by a digital-to-analog converter (DAC) to create an analog voltage signal. The analog voltage signal is applied to a VCO to generate a signal with a first frequency. A counter is used to estimate the output frequency of the VCO in response to the first digital input signal. Thereafter, a second digital input signal, different from the first digital input signal, is applied to the DAC and a second analog signal is applied to the VCO to generate a second frequency. The change in frequency is divided by the difference of the digital input signals to determine $K_{VCO}$. Unfortunately, to achieve $K_{VCO}$ accuracy of less than 2%, a period of time in excess of 50 microseconds is required.

Another approach uses a digital input signal, which is applied to the feedback fractional divider input in the PLL. The VCO output frequency changes in response to the change in divide ratio. After allowing the PLL to settle, the change in VCO input voltage (or tune voltage) as determined by the ADC is used to estimate $K_{VCO}$. To achieve $K_{VCO}$ accuracy of less than 2%, the ADC step should be known and reproducible to much better than 2% accuracy. Also, sufficient settling time should be allowed for the analog voltages to settle to better than 2% accuracy.

Therefore, it would be desirable to economically, efficiently and accurately measure $K_{VCO}$ to an accuracy of less than 2% in the limited time available before the start of a data burst.

SUMMARY

Embodiments of a system include a phase-locked loop (PLL) and a controller.

The PLL is arranged to receive high-pass data at a first input and low-pass data at a second input. The first input is coupled to a primary path and the second input is coupled to a feedback path of the PLL. The controller is coupled to the first input and the second input. The controller adjusts first and second control inputs to keep the input voltage to a voltage-controlled oscillator (VCO) in the PLL constant to determine a gain of the VCO. When the input voltage at the VCO remains within a specified tolerance, the first and second control input voltage values are used to calculate the gain of the VCO. Otherwise, one of the first and second control inputs is modified in accordance with the difference in the input voltage at the VCO.

An embodiment of a method for measuring the gain of a voltage-controlled oscillator (VCO) includes the steps of applying a first control signal to a phase-locked loop (PLL), allowing the PLL to settle, recording a first voltage at the input to the VCO in the PLL, applying a second control signal different from the first control signal to the PLL, adjusting the feedback path to compensate for an expected change in the voltage at the input to the VCO, recording a second voltage at the input to the VCO, determining if time is available to compare the measured change in voltage with a threshold value, wherein when time is unavailable, proceeding to calculate the gain of the VCO and terminating the method. Otherwise, when time is available, determining whether a difference between the second voltage and the first voltage at the input to the VCO is within a specified tolerance, when the difference between the second voltage and the first voltage is not within the specified tolerance, further adjusting the feedback path in response to the difference, repeating the recording, determining and further adjusting steps until the difference between the second voltage and the first voltage at the input to the VCO is within the specified tolerance and calculating the gain of the VCO.

The figures and detailed description that follow are not exhaustive. The disclosed embodiments are illustrated and described to enable one of ordinary skill to make and use systems and methods for VCO gain calibration in a phase-locked loop. Other embodiments, features and advantages of the systems and methods for VCO gain calibration will be or will become apparent to those skilled in the art upon examination of the following figures and detailed description. All such additional embodiments, features and advantages are within the scope of the disclosed systems and methods as defined in the accompanying claims.

BRIEF DESCRIPTION OF THE FIGURES

The systems and methods for VCO gain calibration can be better understood with reference to the following figures. The components within the figures are not necessarily to scale, emphasis instead being placed upon clearly illustrating the principles and operation of the systems and methods. Moreover, in the figures, like reference numerals designate corresponding parts throughout the different views.

DETAILED DESCRIPTION

Figure 1:
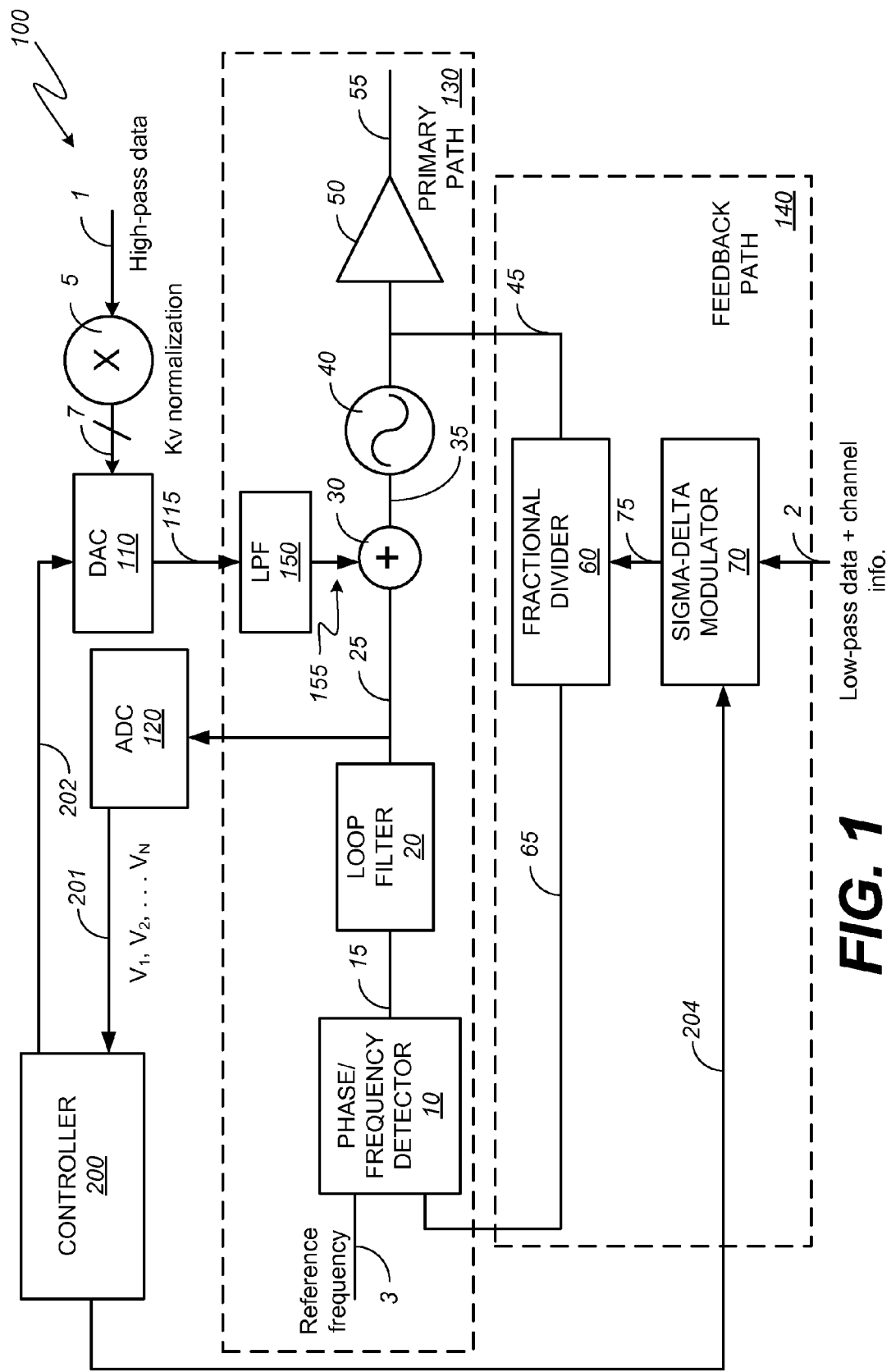
FIG. 1 is a block diagram illustrating an embodiment of a phase-locked loop.

Although described with particular reference to a portable transceiver that uses a two-point modulation scheme, the systems and methods for calibrating $K_{VCO}$ of a PLL can be implemented in any system where it is desirable to identify $K_{VCO}$ while limiting the time that the PLL is in an unlocked condition.

Individual components of a PLL and a controller for calibrating $K_{VCO}$ of the PLL can be implemented in software or various combinations of software and hardware. When implemented in hardware, the PLL and controller can be implemented on a single integrated circuit (e.g., an application specific integrated circuit) or one or both of the PLL and the controller can be implemented using separate hardware elements and logic. When the controller is implemented partially in software, the software portion can be used to precisely control a DAC and a fractional divider that are integrated with the PLL. In addition, the controller will respond in accordance with values received from an ADC integrated with the PLL. The software can be stored in a memory and executed by a suitable instruction execution system (e.g., a microprocessor). A hardware implementation of the controller and the PLL can include any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), etc.

The software for the controller comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

In order to meet the stringent requirements on gain alignment ($K_{VCO}$) between the open loop and closed loop data paths in a transceiver that applies a two-point modulation scheme for GMSK and EDGE, a controller coupled to a PLL is configured to selectively implement the following calibration procedure. First, the controller waits for the PLL to settle after applying a first control signal to the PLL. Once it is confirmed that the PLL has settled, or a predetermined period of time has elapsed, the controller records the initial voltage at the input to the VCO in the PLL. Thereafter, the controller applies a second control signal. The second control signal is different from the first control signal. Substantially simultaneously (or with a predetermined timing relationship, to ensure the fastest settling time of the PLL) with the application of the second control signal, the controller directs a modification in the feedback path that is estimated to offset the change in voltage as seen at the input to the VCO. When an initial estimate for $K_{VCO}$ is close to the actual $K_{VCO}$, the application of the first and second control signals results in a relatively small change in voltage at the input to the VCO and the PLL returns to a locked condition. Once the PLL has settled after the application of the second control signal and the change to the feedback path has been made, the controller records the modified voltage at the input to the VCO. One or more measures of PLL characteristics can be made to determine when the PLL has settled. Alternatively, a suitable wait time determined from a simulation of the response of the PLL can be implemented by a counter. The difference between the initial voltage and the modified voltage at the VCO input is measured. Based on this measured difference a new, more accurate $K_{VCO}$ value is estimated. At this point the $K_{VCO}$ measurement routine can be stopped and the more accurate $K_{VCO}$ value can be stored. In some embodiments, the limited time available restricts the calibration routine to one pass. If time permits or a more accurate $K_{VCO}$ value is desired, this routine is continued. These steps are repeated until the difference between the initial voltage and the modified voltage is below a designated threshold. Once the measurement portion of the calibration procedure is complete, $K_{VCO}$ can be determined in Hz/bit from the ratio of the change in frequency and the number of control bits in the control signal. The change in frequency can be determined by the product of the reference frequency and the difference in fractional divider settings.

Using the two recorded ADC values at the input of the VCO, the error in the $K_{VCO}$ estimation can be calculated. The final accuracy of $K_{VCO}$ depends on the initial error in the $K_{VCO}$ estimate and the measurement accuracy of the change in analog voltage at the input voltage of the VCO.

This method of $K_{VCO}$ estimation is better than the direct method of applying a frequency delta through a fractional divider and then measuring the VCO input voltage for at least the following reasons. First, to achieve accuracy of less than 2% in $K_{VCO}$ using the direct method, the voltage at the VCO input has to settle to its final value with less than 1% error. The time required to reach this level of accuracy is longer than the time available to configure the transmitter for a data transmission under a desired communication protocol. Second, the change in voltage at the input to the VCO is reduced, thus improving PLL settling time. Faster settling times are possible by digitally shaping the steps or transitions applied at the fractional divider input and simultaneously shaping the digital word applied at the input to the DAC in a desired manner. Third, the difference between analog voltages that are applied at the input to the ADC are kept relatively small, thus reducing the dynamic range for the ADC. In addition, the calibration method is less sensitive to errors in ADC gain. Assuming a 10% initial error in the $K_{VCO}$ estimate and a 10% error in ADC gain, the error in the calculated $K_{VCO}$ value is 1%.

Having generally described operation of the systems and methods for measuring the gain of a VCO in a PLL, various additional embodiments will be described with respect to FIGS. 1-5. FIG. 1 is a block diagram illustrating an embodiment of a phase-locked loop. The PLL 100 includes a primary path 130 and a feedback path 140. The primary path 130 includes a phase/frequency detector 10, a loop filter 20 an input node 30, a VCO 40 designed to operate in a designated frequency range, and an amplifier 50. The feedback path 140 includes a fractional divider 60 and a sigma-delta modulator 70. The feedback path 140 starts at the output of VCO 40 and ends at an input to the phase/frequency detector 10.

The primary path 130 is arranged as follows. The phase/frequency detector 10 receives a reference frequency via link 3, a feedback signal (frequency) via link 65 and generates an output that is a measure of the phase/frequency difference between the reference frequency and the feedback signal. The output of the phase/frequency detector 10 is applied via link 15 to loop filter 20. The loop filter 20 filters the phase/frequency output or error signal and applies the filtered output to VCO 40 via link 25, node 30 and link 35. The VCO 40 generates an output signal that oscillates in response to the voltage applied at its input. The output signal is coupled via link 45 to amplifier 50 and fractional divider 60. The amplifier 50 receives the output of the VCO 40 and provides an amplified version of the VCO output via link 55 to one or more devices external to the PLL 100 that require a stable frequency at N×the reference frequency, where N is the value applied via the fractional divider 60. As shown in the illustrated embodiment, high-pass data is received via DAC 110, link 115, low-pass filter 150 and link 155 at node 30.

The feedback path 140 is arranged as follows. The feedback path starts at link 45, which couples the output of VCO 40 to amplifier 50 and fractional divider 60. Fractional divider 60 operates under the control of sigma-delta modulator 70, which controls fractional divider 60 via link 75. The output of the fractional divider is applied via link 65 to a feedback input of the phase/frequency detector 10. As shown in the illustrated embodiment, low-pass data and channel information is received via link 2 at sigma-delta modulator 70.

As is known, if the reference frequency×N does not equal the output frequency, the phase-error signal, after being filtered and amplified, causes the VCO frequency to deviate in the direction of the product of the reference frequency and N. When conditions are right, the VCO will quickly "lock" or settle to the product of the reference frequency and N, thus maintaining a fixed relationship with the input signal.

As shown in the illustrated embodiment, high-pass data is received via link 1 at a digital scaling block 5, which adjusts the high-pass data in anticipation of the frequency response (i.e., $K_V$ normalization) of the VCO 40. Digital scaling block 5 is coupled to DAC 110 via bus 7. DAC 110 applies an output voltage along link 115 that is responsive to the signals on bus 7. Link 115 is coupled to low-pass filter 150, which reduces undesired high-frequency noise in the output voltage. Low-pass filter 150 applies the filtered output voltage via link 155 to node 30, which is inserted between loop filter 20 and VCO 40 in the primary path 130. In operation, the PLL 100 responds to changes in the reference frequency, the high-pass data applied via the DAC 110 and the low-pass data applied in the feedback path 140 via the sigma-delta modulator 70 and fractional divider 60. The output of the loop filter 20, which may be an integrating low-pass filter, stabilizes, resulting in a stable input voltage at the input to the VCO 40 and a fixed frequency at the output of the VCO 40.

In the illustrated embodiment, PLL 100 is integrated with a controller 200. The controller 200 receives a sequence of voltage values via ADC 120, which is coupled to link 25 between the loop filter 20 and the VCO 40. As will be explained in greater detail, controller 200 is configured to execute a calibration procedure to determine a present value of $K_{VCO}$ within 2% accuracy.

Controller 200 accomplishes the calibration procedure via coordinated application of first and second control signals via link 202, which apply distinct voltages at the DAC 110 in the absence of high-pass data. Any convenient DAC inputs (in the form of digital words) can be applied. The difference in the resulting voltage at the input to the VCO 40 should be large enough that a reliable estimate of $K_{VCO}$ can be made. A suitable difference will vary with the change in output frequency due to operational conditions. The controller 200 applies a third control signal via link 204, which directs the sigma-delta modulator 70 to modify the fractional divider in the absence of low-pass data. The third control signal is responsive to an estimate of the $K_{VCO}$. When the estimated $K_{VCO}$ is accurate, the coordinated application of the second control signal and the third control signal result in little, if any, change in the voltage at the input of the VCO 40. The change, if any, in voltage is measured by the ADC 120. Based on the initial $K_{VCO}$ estimate and the ADC reading, a more accurate $K_{VCO}$ is calculated. The calibration routine can be stopped at this point or continued further if a more accurate $K_{VCO}$ estimation is desired. When the change in the voltage at the input of the VCO 40 is below a threshold value, $K_{VCO}$ can be determined by the ratio of the change in frequency at the output of the VCO 40 and the number of bits in the DAC 110. The change in frequency at the output of the VCO 40 can be determined from the product of the difference of the final and initial divider settings and the reference frequency.

Figure 2:
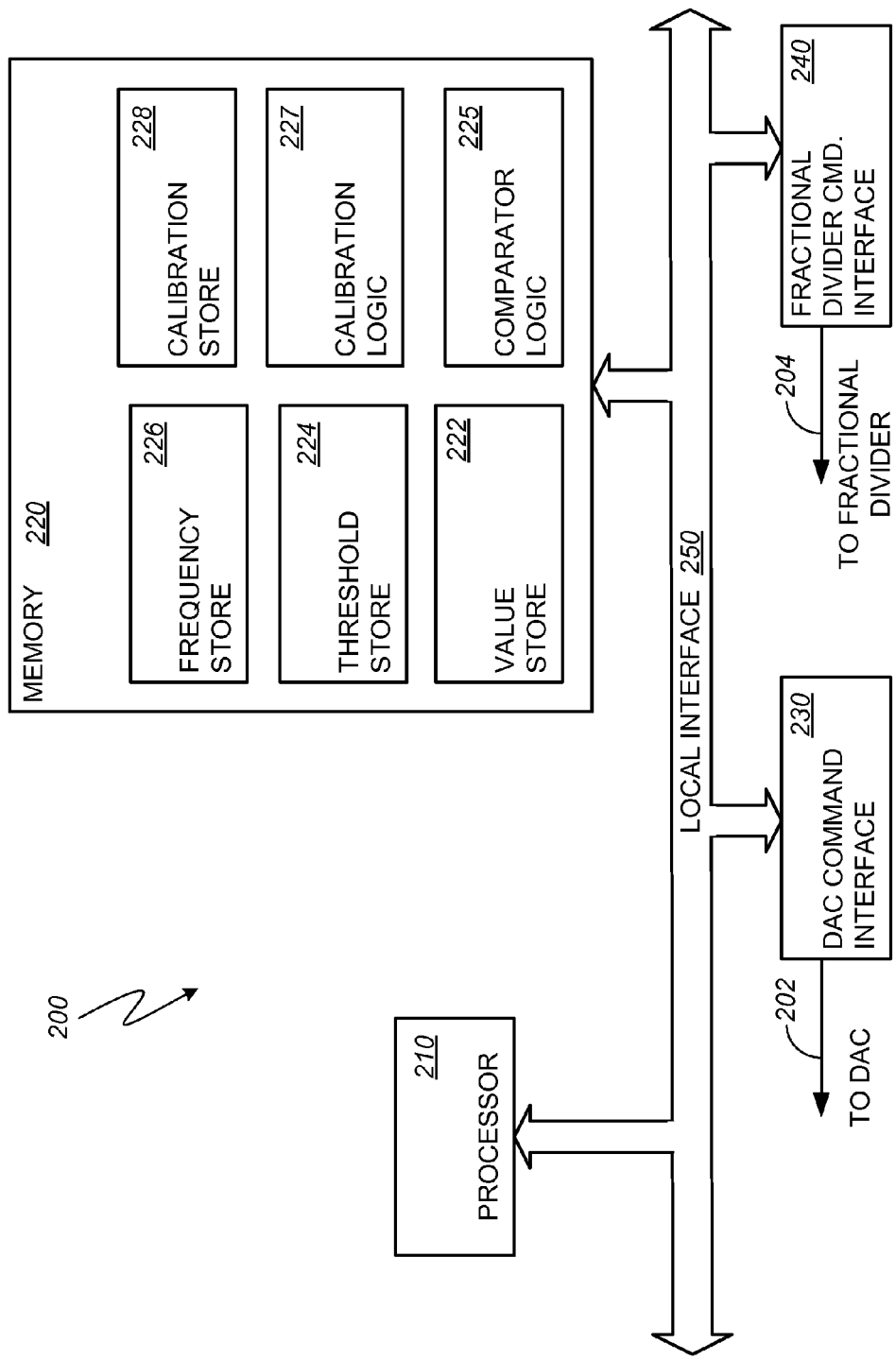
FIG. 2 is a block diagram illustrating an embodiment of the controller of FIG. 1.

FIG. 2 is a schematic diagram illustrating functional components of the controller 200 of FIG. 1. The illustrated embodiment of the controller 200 is simplified to illustrate the functional elements that enable the controller 200 to direct a calibration procedure by manipulating two control inputs of the PLL 100 and periodically recording the voltage at the input to the VCO 40. The controller 200 includes a processor 210, a memory 220, a DAC command interface 230 and a fractional divider command interface 240 that are communicatively coupled to each other via a local interface 250.

The local interface 250 can be, for example but not limited to, one or more buses or other wired or wireless connections, as is known in the art. The local interface 250 may have additional elements, such as controllers, buffers (caches), drivers, repeaters, and receivers, to enable communications. Further, the local interface 250 may include address, control, power and/or data connections to enable appropriate communications among the aforementioned components.

The processor 210 is a hardware device for executing software or logic, particularly calibration logic 227 and comparator logic 225 that are stored in the memory 220. The processor 210 can be any custom made or commercially available processor configured to execute instructions.

The memory 220 can include any one or a combination of volatile memory elements (e.g., random-access memory (RAM), such as dynamic random-access memory (DRAM), static random-access memory (SRAM), synchronous dynamic random-access memory (SDRAM), etc.) and non-volatile memory elements (e.g., read-only memory (ROM), a flash memory, an electronically erasable programmable read only memory (EEPROM), etc.). The memory 220 can have a distributed architecture, where various components are situated remote from one another, but still accessible via the processor 210.

One or more programs, each of which comprises an ordered listing of executable instructions for implementing logical functions can be stored in the memory 220. In addition, the memory 220 may include an operating system (not shown) that essentially controls the execution of the illustrated functions and perhaps additional functions such as scheduling, input-output control, file and data management, memory management, communication control and related services.

In the illustrated embodiment, the memory 220 includes a value store 222, a threshold store 224, a frequency store 226, a calibration store 228, as well as comparator logic 225 and calibration logic 227. The value store 222 is arranged to store at least two voltage levels or values that are received from ADC 120 (FIG. 1). The threshold store 224 is arranged to store a threshold value. The frequency store 226 is arranged to store a reference frequency. The calibration store 228 is arranged to store an estimate of $K_{VCO}$ at a desired output frequency.

Calibration logic 227 is arranged to coordinate the actions of the DAC command interface 230, the fractional divider command interface 240, comparator logic 225 and the various stores. For example, calibration logic 227 can be arranged to confirm that the threshold store 224 and frequency store 226 are holding valid data prior to continuing with additional steps in a calibration sequence or procedure. Calibration logic 227 is configured to use comparator logic 225 and consecutively received voltages in value store 222 or consecutively received frequencies in frequency store 226 to determine when PLL 100 is in a locked condition.

Calibration logic 227 is further configured to apply basic mathematical functions on values from one or more of the stores or other registers accessible by processor 210. Comparator logic 225 is configured to compare the difference of the two voltage values with the threshold value under the direction of the calibration logic 227. The comparator logic 225 is configured to set a flag or otherwise indicate to the calibration logic 227 when the difference between the voltage values is less than or equal to the value stored in threshold store 224.

In a coordinated fashion, calibration logic 227 directs the DAC command interface 230 to apply a first control signal via link 202 that is within the dynamic range of the DAC 110. The calibration logic 227 updates an initial recorded voltage level in value store 222 once the comparator logic 225 indicates that the PLL is locked or after a pre-determined delay. Thereafter, the calibration logic 227 directs the DAC command interface to apply a second control signal via link 202 that is different from the first control signal at the DAC 110. This second control signal can be a digital step from one DAC value to the other, or the trajectory from one DAC value to the other can be controlled in a desired fashion. Substantially simultaneously with the application of the second control signal or using a pre-determined timing relationship that assures a desired settling time of the PLL, calibration logic 227 directs the fractional divider interface 240 to apply a signal via link 204 that results in an adjustment of the fractional divider in the feedback path of the PLL such that the voltage at the input to the VCO 40 does not change. Again, this change in the division ratio can be an abrupt step or the trajectory from one value to another can be shaped in time, so as to minimize the PLL settling time. The magnitude of the adjustment or adjustments made at the fractional divider is in response to an estimated $K_{VCO}$ that is stored in calibration store 228. The difference between the recorded VCO input voltages on link 25 is stored. Based on this stored value and the old $K_{VCO}$ estimate a new $K_{VCO}$ is calculated. The calibration routine can be stopped at this point. If greater accuracy is desired and sufficient time is available, the routine can continue until the difference between recorded values at the VCO input is less than a pre-determined threshold value. Accordingly, the change in the fractional divider 60 will enable the calibration procedure to quickly achieve a change in the recorded voltages at the input to the VCO 40 that does not exceed the designated threshold.

The DAC command interface 230 performs signal conditioning to enable control of DAC 110 via link 202. The fractional divider command interface 240 performs signal conditioning to enable control of fractional divider 60 via link 204 and sigma-delta modulator 70.

Figure 3:
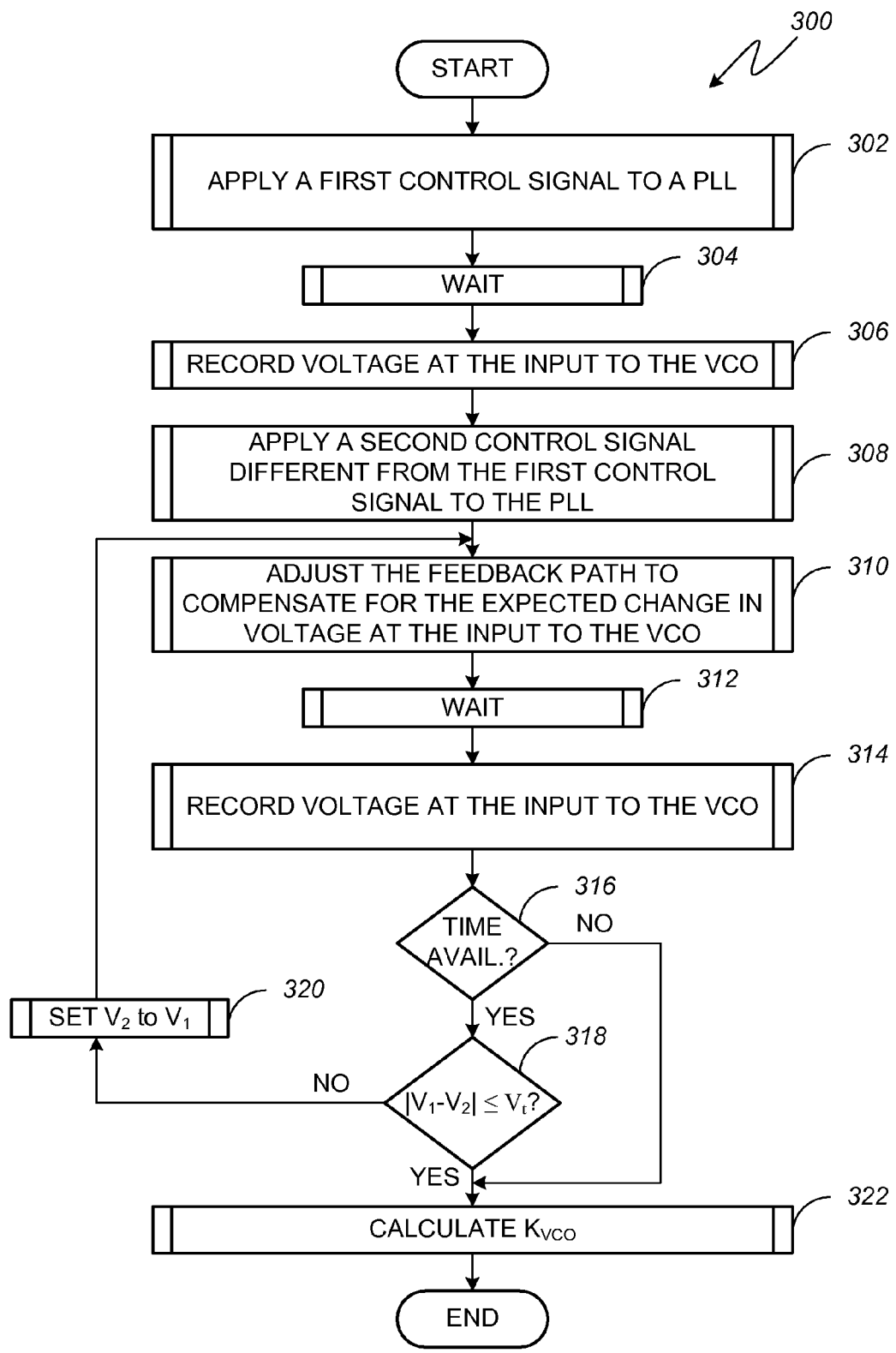
FIG. 3 is a flow diagram illustrating an embodiment of a method for calibrating the gain of the voltage-controlled oscillator of FIG. 1.

FIG. 3 is a flow diagram illustrating an embodiment of a method for calibrating the gain of the VCO 40 of FIG. 1. The flow diagram of FIG. 3 shows the architecture, functionality, and operation of a possible implementation via software and or firmware associated with a PLL arranged in a two-point modulation architecture. In this regard, each block represents a module, segment, or portion of code, which comprises one or more executable instructions for implementing the specified function(s). When the PLL 100 is implemented via hardware, hardware and firmware or a combination of hardware and software, one or more blocks in the flow diagram may represent a circuit or circuits.

Method 300 begins with block 302 where a first control signal that directs the DAC to generate a first voltage within its dynamic range is applied to a PLL. In block 304, a counter or other delay element is applied to allow the PLL to settle. A PLL is settled when the PLL is producing a stable output frequency or when the input voltage to the VCO 40 has reached a steady value.

In block 306, the ADC is used to record voltage $V_1$, the voltage at the input to the VCO when the DAC receives the first control signal and applies a first analog voltage at the input to the VCO. Thereafter, as indicated in block 308, a second control signal different from the first control signal is applied to the PLL via the DAC. As close as possible in time to the application of the second control signal in block 308 or in accordance with a timing relationship, a fractional divider in the feedback path is adjusted using an estimate of the $K_{VCO}$ to compensate for the expected change in voltage at the input to the VCO, as shown in block 310. In block 312, a counter or other delay element is applied to allow the PLL to settle. When the divider step and the DAC step are appropriately matched and the estimate of $K_{VCO}$ is accurate, the PLL will lock or settle quickly. Next, as indicated in block 314, voltage $V_2$, the voltage at the input to the VCO when the DAC is set to the second control signal is recorded.

Thereafter, as indicated in decision block 316, it is determined whether there is sufficient time to perform additional voltage measurements. When time is not available processing continues with block 322. When the initial estimate of $K_{VCO}$ is known to 10% accuracy and the combination of PLL settling time and ADC gain/step give rise to another 10% error in the recorded input voltage difference to the VCO, $K_{VCO}$ can be calculated to 1% accuracy. Otherwise, when time is available or a more accurate measure is desired, processing continues with decision block 318. As shown in decision block 318, a test is performed to determine if the first and second recorded voltages (i.e., $V_1$ and $V_2$) are nearly equal in magnitude with each other. When the absolute value of the difference of the first and second recorded voltages is not equal to or below a desired threshold value, processing continues with block 320 where the value of V1 is replaced with the value of V2 before returning to block 310, as indicated by the flow control arrow exiting block 320. For each subsequent adjustment of the fractional divider after the initial adjustment, the frequency division ratio will be adjusted as a function of a new estimate from the magnitude of the difference of the first and second recorded voltages. Otherwise, when it is determined in block 318 that the difference of the first and the second recorded voltages is less than a desired threshold value, processing continues with block 322 where a calculation is performed to determine the present gain of the VCO.

Figure 4:
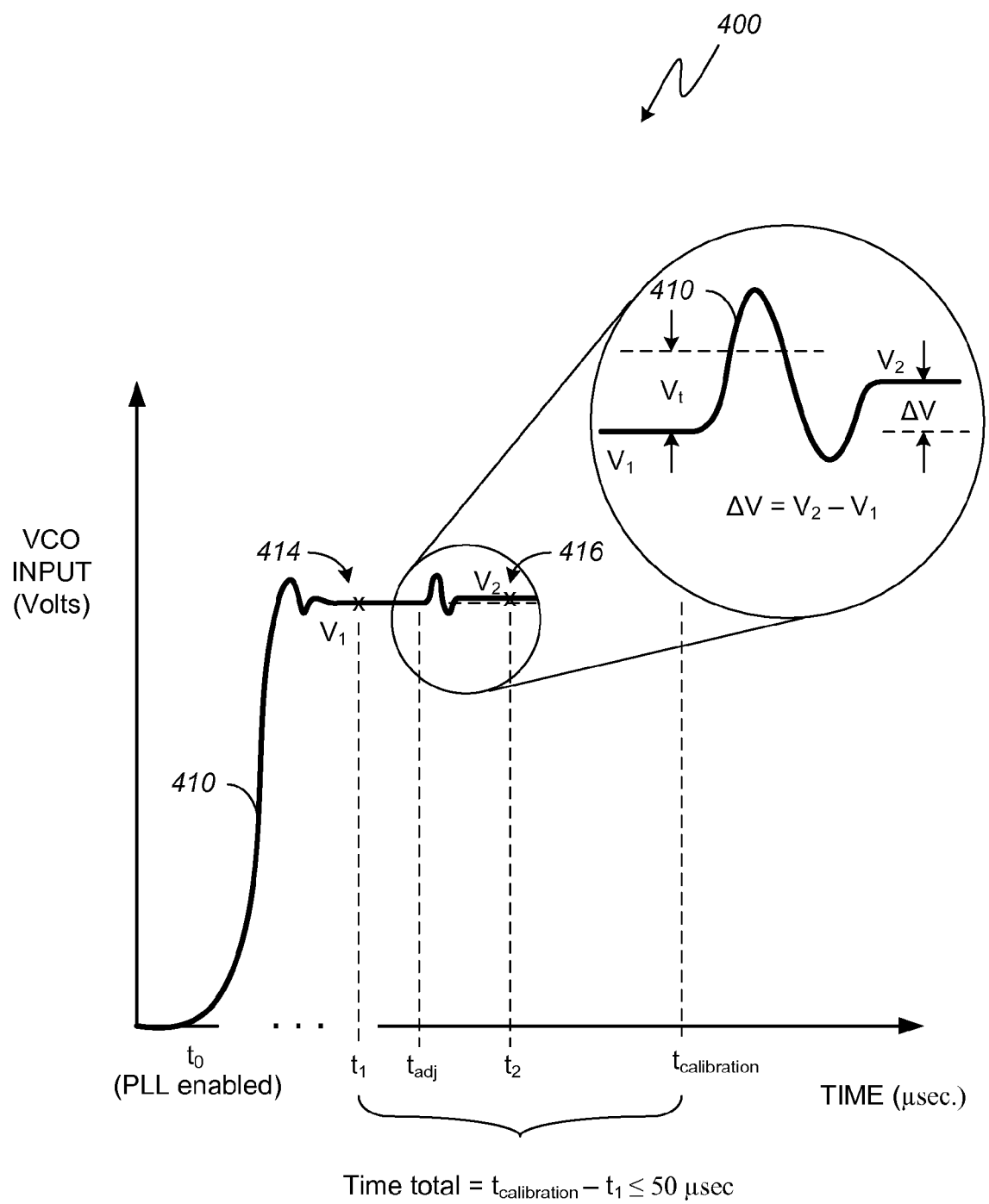
FIG. 4 is a plot illustrating the input voltage to the voltage-controlled oscillator of FIG. 1 during a calibration process.

FIG. 4 is a plot illustrating the input voltage to the VCO 40 of FIG. 1 during an example calibration process. Plot 400 depicts time along a horizontal axis and the VCO input in volts along the vertical axis. Trace 410 shows that the input voltage to the VCO rapidly increases from the initial voltage after $t_0$, that is, after the PLL is enabled. Trace 410 overshoots and quickly settles to voltage $V_1$ where trace 410 remains stable for a period of time. As shown in FIG. 4, trace 410 is at $V_1$ at time $t_1$. The time from to $t_1$ is a predetermined time, which can be determined by simulation. At time $t_{adj}$, both the control signal to the DAC and the control signal to the fractional divider are modified. As described above, these respective control signals can be applied in accordance with a predetermined timing relationship to minimize PLL settling time. In the illustrated embodiment, the control signal to the DAC is changed to a higher value within the dynamic range of the DAC. The fractional divider is adjusted to compensate for the expected change that the DAC will cause to the voltage at the input to the VCO. Trace 410 shows that the input voltage to the VCO changes from $V_1$ to $V_2$. For a brief period of time trace 410 indicates that the PLL is not settled or locked. Once the PLL settles at $V_2$, trace 410 remains stable. The period from $t_{adj}$ to $t_2$ is known by simulation. Consequently, a counter can be used to implement a desired delay during which the PLL will settle. A settled or locked PLL with the modified DAC input signal and adjusted fractional divider setting is shown by trace 410 (at $V_2$) at time $t_2$.

If the time available for the calibration is approximately 50 microseconds, the magnitude of the difference between $V_2$ and $V_1$ is recorded and $K_{VCO}$ is estimated. If more time is available, the routine is continued until, as is further shown in FIG. 4, the magnitude of the difference between $V_2$ and $V_1$ is smaller than a designated threshold $V_t$. When this is the case, the data recording portion of the calibration procedure is deemed complete and $K_{VCO}$ is determined from the reference frequency and the change in the fractional divider setting.

Figure 5:
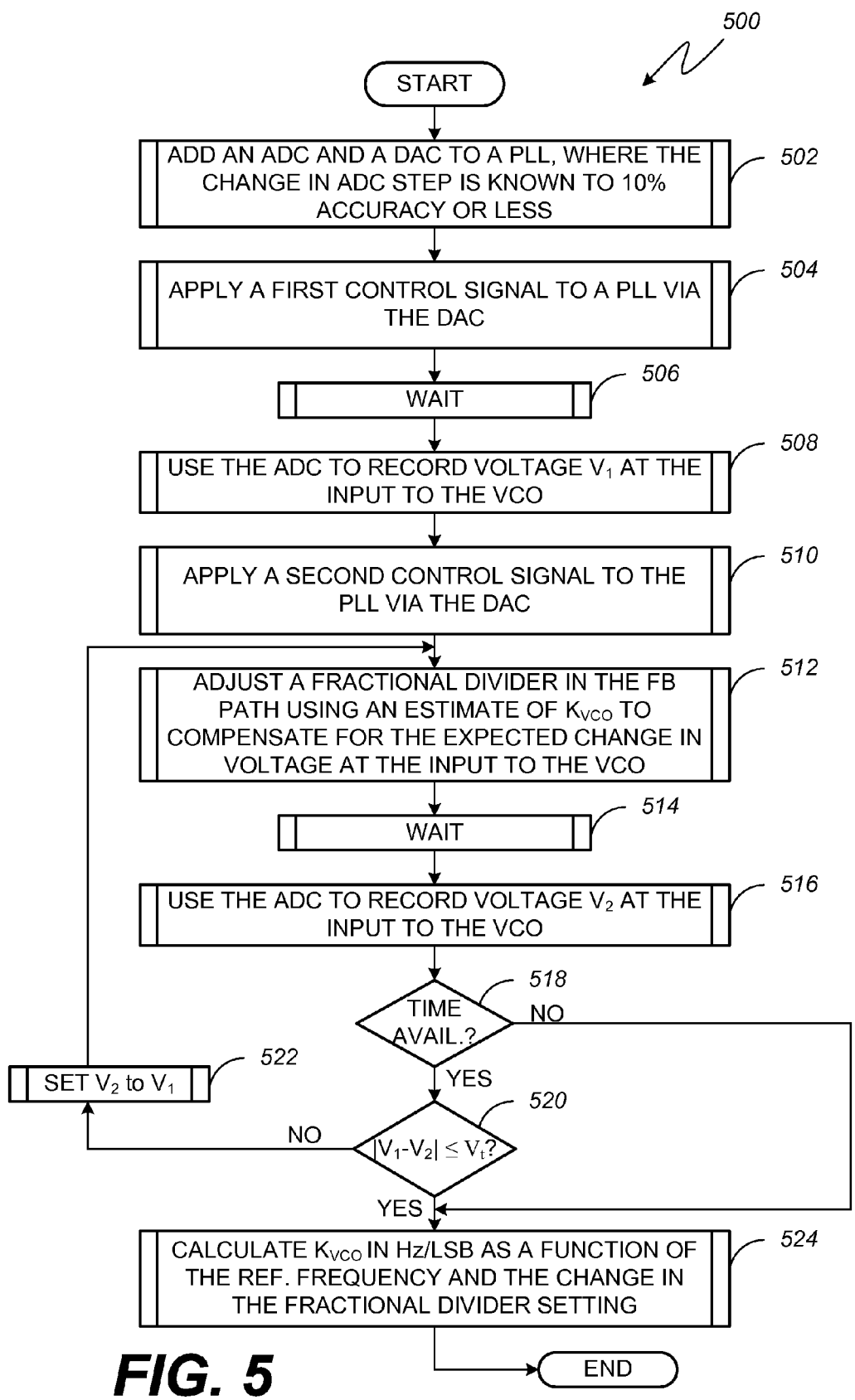
FIG. 5 is a flow diagram illustrating an alternative embodiment of a method for calibrating the gain of a voltage-controlled oscillator of FIG. 1 during a calibration process.

FIG. 5 is a flow diagram illustrating an embodiment of another method for determining the gain of a VCO 40 in the PLL 100 (FIG. 1). The flow diagram of FIG. 5 shows the architecture, functionality, and operation of a possible implementation via software and or firmware associated with a PLL arranged in a two-point modulation architecture. In this regard, each block represents a module, segment, or portion of code, which comprises one or more executable instructions for implementing the specified function(s). When the PLL 100 is implemented via hardware, hardware and firmware or a combination of hardware and software, one or more blocks in the flow diagram may represent a circuit or circuits.

Method 500 begins with block 502 where an ADC and a DAC are integrated with a PLL. ADC gain is known to at least 10% accuracy. After the PLL is enabled, a first control signal that directs the DAC to generate a first voltage is applied to the PLL, as indicated in block 504. Specifically, the output of the DAC is applied to the input of the VCO Thereafter, as shown in block 506, a controller waits for a fixed period of time. The fixed period of time is set in accordance with a simulated time required for the PLL to settle.

In block 508, the ADC is used to record voltage $V_1$, the voltage at the input to the VCO when the DAC is set to via the first control signal. Thereafter, as indicated in block 510, a second control signal is applied to the PLL via the DAC. Thereafter, as indicated in block 512, a fractional divider in the feedback path is adjusted using an estimate of the $K_{VCO}$ to compensate for the expected change in voltage at the input to the VCO. Next, a controller waits for a fixed period of time, as indicated in block 514. When the ADC and the DAC are well matched and the estimate of $K_{VCO}$ is accurate, the PLL will lock very quickly. The fixed period of time represented in block 506 may be the same or different than the fixed period of time represented in block 514. Once the PLL has settled, the ADC is used to record voltage $V_2$, the voltage at the input to the VCO when the DAC is set via the second control signal, as indicated in block 516. When time is unavailable to perform a more accurate measurement, processing continues with block 524. Otherwise, when time is available or a more accurate measure is desired, processing continues with decision block 520. As shown in decision block 520, a test is performed to determine if the first and second recorded voltages (i.e., $V_1$ and $V_2$) are nearly equal in magnitude with each other. When the absolute value of the difference of the first and second recorded voltages is not equal to or below a desired threshold value, processing continues with block 522 where the value of $V_1$ is replaced with the value of $V_2$ before returning to block 512, as indicated by the flow control arrow exiting block 522. For each subsequent adjustment of the fractional divider after the initial adjustment, the frequency division ratio will be adjusted as a function of a new estimate from the magnitude of the difference of the first and second recorded voltages.

Otherwise, when it is determined in block 520 that the difference of the first and the second recorded voltages is less than a desired threshold value, processing continues with block 524 where a calculation is performed to determine the present gain of the VCO in Hz/LSB as a function of the reference frequency and the change in the fractional divider setting.

$K_{VCO}$ can be calculated to about 1% accuracy with one pass through the calibration procedure. If $K_{VCO}$ is initially estimated to about 10% accuracy and the ADC step is known to 10% accuracy, then $K_{VCO}$ in Hz/LSB will be accurate to about 1%. An initial factory calibration routine can be used to estimate $K_{VCO}$ and ADC gain to within 10% accuracy. Alternatively, previous estimates for $K_{VCO}$ (from the last transmission burst or the last time the calibration was performed) can be used as a starting point.

Using the above described systems and methods $K_{VCO}$ can be calibrated to the required accuracy within two settling times of the PLL. Using a PLL having about a 50-100 kHz loop bandwidth in calibration mode, the calibration and final settling can be achieved in approximately 150 microseconds.

As described above, the flow diagrams of FIGS. 3 and 5 show the architecture, functionality and operation of an implementation of example methods for determining $K_{VCO}$ in a PLL. The described functions can be embodied in source code including human-readable statements written in a programming language or machine code that comprises instructions recognizable by a suitable execution system such as a processor in a computer system. The machine code may be converted from the source code, etc. If embodied in hardware, as in preferred embodiments, each block may represent a circuit or a number of interconnected circuits to implement the specified logical function(s).

While various embodiments of the systems and methods for VCO gain calibration have been described, it will be apparent to those of ordinary skill in the art that many more embodiments and implementations are possible that are within the scope of this disclosure. Accordingly, the systems and methods for VCO gain calibration are not to be restricted except in light of the attached claims and their equivalents.

What is claimed is:

1. A method for measuring gain of a voltage-controlled oscillator (VCO), comprising:
    applying a first control signal to a phase-locked loop (PLL);
    allowing the PLL to settle;
    recording a first voltage at the input to the VCO in the PLL;
    applying a second control signal different from the first control signal to the PLL;
    adjusting the feedback path to compensate for an expected change in the voltage at the input to the VCO;
    recording a second voltage at the input to the VCO;
    determining if time is available to compare the measured change in voltage with a threshold value, wherein when time is unavailable proceeding to calculate the gain of the VCO and terminating the method, otherwise when time is available;
    determining whether a difference between the second voltage and the first voltage at the input to the VCO is within a specified tolerance;
    when the difference between the second voltage and the first voltage is not within a specified tolerance, further adjusting the feedback path in response to the difference;
    repeating the recording, determining and further adjusting steps until the difference between the second voltage and the first voltage at the input to the VCO is within the specified tolerance; and
    calculating the gain of the VCO.

2. The method of claim 1, wherein applying the first control signal comprises communicating a first digital word to a digital-to-analog converter.

3. The method of claim 1, wherein recording one of a first voltage and a second voltage at the input to the VCO comprises an analog-to-digital conversion.

4. The method of claim 1, wherein applying the second control signal is responsive to an estimate of the gain of the VCO.

5. The method of claim 4, wherein applying the second control signal comprises communicating a second digital word to a digital-to-analog converter.

6. The method of claim 1, wherein adjusting the feedback path comprises programming a fractional divider.

7. The method of claim 6, wherein programming the fractional divider compensates for the change in frequency due to a digital-to-analog conversion.

8. The method of claim 1, wherein applying the first control signal to the PLL further comprises using a PLL having a bandwidth of approximately 100 kHz.

9. The method of claim 1, wherein calculating the gain of the VCO comprises determining a ratio of frequency/bit.

10. The method of claim 9, wherein calculating the gain of the VCO comprises determining frequency using a difference of an initial divider setting to a final divider setting multiplied by a reference frequency.

11. The method of claim 1, wherein recording the first and second voltages comprises using an analog-to-digital converter (ADC).

12. The method of claim 11, wherein an ADC gain/step is known within ten percent accuracy.

13. The method of claim 12, wherein an estimated value of the gain of the VCO is known within ten percent accuracy.

14. The method of claim 13, wherein the gain of the VCO is calculated within one percent accuracy with one pass through the method.

15. A system, comprising:
    a phase-locked loop (PLL) arranged to receive high-pass data at a first input and low-pass data at a second input, the first input coupled to a primary path and the second input coupled to a feedback path;
    a controller coupled to the first input and the second input, the controller configured to adjust first and second control inputs in an attempt to keep the input voltage to a voltage-controlled oscillator in the PLL constant to determine a gain of the VCO.

16. The system of claim 15, wherein the first control input is applied to a digital-to analog converter (DAC), the output of the DAC being applied to an input of the VCO.

17. The system of claim 15, wherein respective digital inputs applied to a fractional divider in the feedback path and to a digital-to-analog converter are shaped to result in reduced settling times for the PLL.

18. The system of claim 15, wherein the second control input is applied to a fractional divider.

19. The system of claim 15, wherein the controller is actuated prior to a transmission burst in a transceiver that applies two-point modulation.

20. The system of claim 18, wherein the controller and PLL are implemented within a GSM/EDGE single integrated-circuit transceiver.

* * * * *